United States Patent
Sugino et al.

(10) Patent No.: US 9,676,348 B2
(45) Date of Patent: Jun. 13, 2017

(54) SHIELD CONDUCTIVE PATH

(71) Applicant: SUMITOMO WIRING SYSTEMS, LTD., Yokkaichi, Mie (JP)

(72) Inventors: Hidetoshi Sugino, Mie (JP); Masanori Kuwahara, Mie (JP); Hidehiko Iwakawa, Mie (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 177 days.

(21) Appl. No.: 14/618,120

(22) Filed: Feb. 10, 2015

(65) Prior Publication Data

US 2015/0246647 A1  Sep. 3, 2015

(30) Foreign Application Priority Data

Mar. 3, 2014  (JP) .................................. 2014-040398

(51) Int. Cl.
| | |
|---|---|
| *B60R 16/02* | (2006.01) |
| *H05K 9/00* | (2006.01) |
| *H01B 7/17* | (2006.01) |

(52) U.S. Cl.
CPC ....... *B60R 16/0215* (2013.01); *H05K 9/0098* (2013.01)

(58) Field of Classification Search
CPC ..... B60R 16/0215; H01B 7/17; H05K 9/0098
See application file for complete search history.

(56) References Cited

U.S. PATENT DOCUMENTS

| | | | | |
|---|---|---|---|---|
| 6,800,811 | B1* | 10/2004 | Boucino | H01B 11/06 174/113 C |
| 2004/0099427 | A1 | 5/2004 | Kihira | |
| 2004/0256136 | A1* | 12/2004 | Dunand | H02G 3/0468 174/71 R |
| 2011/0259626 | A1* | 10/2011 | Speer | H01B 11/10 174/113 C |
| 2012/0279776 | A1 | 11/2012 | Mizutani | |
| 2014/0262422 | A1* | 9/2014 | Wessels, Jr. | H01B 11/06 174/102 R |
| 2015/0107871 | A1* | 4/2015 | Adachi | B60R 16/0215 174/102 C |
| 2016/0165765 | A1* | 6/2016 | Yamada | H02G 3/0481 174/350 |

FOREIGN PATENT DOCUMENTS

| | | |
|---|---|---|
| JP | 2004171952 A | 6/2004 |
| JP | 2011146228 A | 7/2011 |

\* cited by examiner

*Primary Examiner* — Timothy Thompson
*Assistant Examiner* — Amol Patel
(74) *Attorney, Agent, or Firm* — Oliff PLC (57) ABSTRACT

A shield conductive path may include a tubular shield portion that surrounds a plurality of electric wires. The shield conductive path may further include a partition portion that partitions an interior space of the shield portion into a plurality of electrical wire insertion paths. A specific electrical wire may be inserted through a specific electrical wire insertion path of the plurality of electrical wire insertion paths and may be guided out from a guiding-out opening formed in the shield portion, to the outside of the shield portion, and this guiding-out opening can be formed within an area, of the shield portion, provided with the partition portion.

11 Claims, 7 Drawing Sheets

SHIELD CONDUCTIVE PATH

CROSS-REFERENCE TO RELATED APPLICATIONS

This application claims priority to Japanese Patent Publication No. 2014-040398, filed on Mar. 3, 2014, the disclosure which is incorporated herein by reference its entirety.

TECHNICAL FIELD

Embodiments of the present application relate to a shield conductive path configured such that a plurality of electrical wires are surrounded by a tubular shield portion.

BACKGROUND

In vehicles such as hybrid automobiles, for example, electrical wires may be arranged under a floor of the vehicle so as to connect a device such as a high-voltage battery mounted in the vehicle rear portion and a device such as an inverter or a fuse box mounted in the vehicle front portion. At that time, the plurality of electrical wires are inserted through a metal pipe so as not only to realize a shield function but also to protect the electrical wires from contact with foreign substances. Flexible tubular shield members are connected to the end portions of the pipe. The electrical wires, at portions thereof guided out from the pipe, are shielded by being surrounded by the tubular shield members, and are made flexibly bendable when being connected to the devices (see JP 2004-171952A, for example).

Furthermore, for example, if the plurality of electrical wires include various types of electrical wires such as a power-supply electrical wire through which a high-voltage and large current flows and a low current based electrical wire and there may be a unidirectional or bidirectional influence of electromagnetic noise therebetween, in order to prevent the influence of electromagnetic noise, the interior of the pipe is partitioned by partition walls into a plurality of insertion spaces so that noise is blocked in each space (see JP 2011-146228A, for example).

JP 2004-171952A and JP 2011-146228A are examples of related art.

Thus, if a plurality of types of electrical wires are arranged between the front and the rear of a vehicle, it is conceivable that the plurality of types of electrical wires are separately inserted through a metal pipe the interior of which is partitioned by partition walls into a plurality of insertion spaces, and tubular shield members are connected to the end portions of the pipe. If a certain type of electrical wire is branched from the plurality of types of electrical wires toward its connection destination, for example, it is conceivable that the electrical wire is drawn out from an intermediate position on the tubular shield members.

However, this configuration needs improvement, because the plurality of types of electrical wires that are separated from each other inside the pipe are not separated from each other inside the tubular shield member, and the electrical wires may be affected by electromagnetic noise at an electrical wire branch portion.

SUMMARY

Embodiments of the present application were made in view of these circumstances, and it is an object of embodiments of the present application to provide a shield conductive path in which electrical wires can be prevented from being affected by electromagnetic noise at an electrical wire branch portion.

Embodiments of the present application are directed to a shield conductive path in which may include a tubular shield portion that surrounds a plurality of electric wires. The shield conductive path may also include a partition portion that partitions an interior space of the shield portion into a plurality of electrical wire insertion paths. A specific electrical wire may be inserted through a specific electrical wire insertion path of the plurality of electrical wire insertion paths and may be guided out from a guiding-out opening formed in the shield portion, to the outside of the shield portion, and this guiding-out opening can be formed within an area, of the shield portion, provided with the partition portion.

Additionally, a method may include surrounding a plurality of electric wires with a shield portion. The method may also include partitioning an interior space of the shield portion into a plurality of electrical wire insertion paths with partition portion. And, the method may include inserting a specific electrical wire through a specific electrical wire insertion path of the plurality of electrical wire insertion paths and guiding the specific electrical wire out through a guiding out opening formed in the shield portion to the outside of the shield portion, wherein the guiding-out opening is formed within an area, of the shield portion, provided with the partition portion.

According to embodiments of the present application, a specific electrical wire from among the plurality of electrical wires is guided out from the shield portion within an area partitioned by the partition portion from the other electrical wire insertion paths. Thus, the electrical wires can be prevented from being affected by electromagnetic noise at an electrical wire branch portion.

DETAILED DESCRIPTION

Discussed herein are embodiments of a shield conductive path. According to at least some embodiments of the present application the shield conductive path may be a device and/or system. The shield conductive path may be configured such that a shield portion has a shield pipe through which all of the plurality of electrical wires may be inserted, and a tubular flexible shield member that is connected to an end portion of the shield pipe, and that can surround the electrical wires, at each portion thereof guided out from the shield pipe, the partition portion has a partition wall that partitions an interior of the shield pipe into the plurality of electrical wire insertion paths, and a partition tube portion that may be in the shape of a tube surrounding the specific electrical wire, and that may project from an end face of the shield pipe, to the outside of the flexible shield member, and the guiding-out opening may be formed at an end portion of the partition tube portion arranged outside the flexible shield member.

With this configuration, the specific electrical wire may be guided out via the partition tube portion to the outside of the flexible shield member, and, thus, the electrical wires can be prevented from being affected by electromagnetic noise at an electrical wire branch portion.

Furthermore, the shield conductive path according to embodiments of the present application may be configured such that the partition tube portion and an end portion of the specific electrical wire insertion path are in the shape of perfect circles, and the partition tube portion is press-fitted to the end portion of the specific electrical wire insertion path.

With this configuration, the partition tube portion can be press-fitted with no gap to the end portion of the specific electrical wire insertion path, and, thus, noise can be reliably blocked.

Furthermore, the shield conductive path according to embodiments of the present application may be configured such that the shield portion has a shield pipe through which all of the plurality of electrical wires may be inserted, the partition portion may be a partition wall that partitions an interior of the shield pipe into the plurality of electrical wire insertion paths, and the guiding-out opening may be formed at an intermediate position on a circumferential wall of the shield pipe, at a portion thereof forming the specific electrical wire insertion path.

With this configuration, the specific electrical wire may be drawn out from an intermediate position on the shield pipe partitioned by the partition wall, and, thus, the electrical wires can be prevented from being affected by electromagnetic noise at an electrical wire branch portion.

EXAMPLE 1

Hereinafter, an example of one embodiment of the present application will be described in detail with reference to FIGS. 1 to 5.

Figure 1:
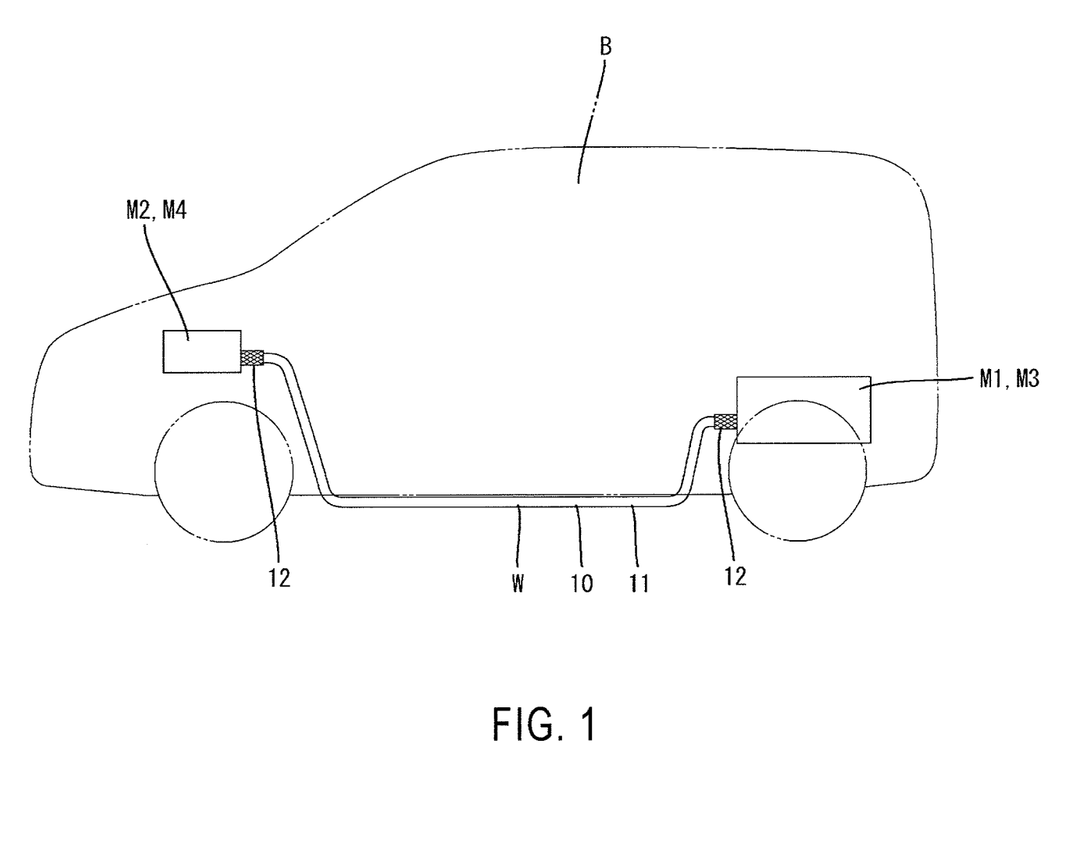
FIG. 1 is a schematic side view showing an arrangement route of a shield conductive path in Example 1.
Figure 2:
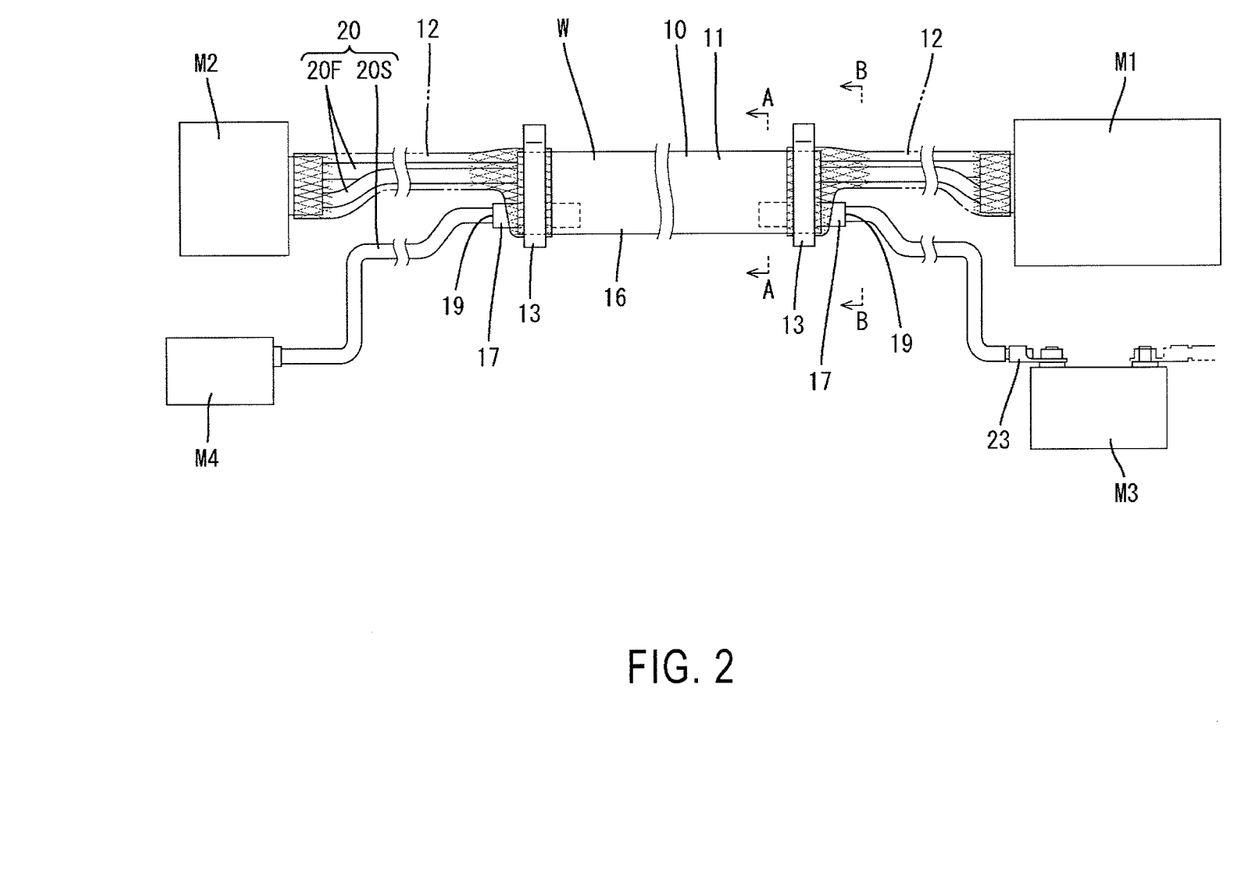
FIG. 2 is a schematic side view showing a state in which the shield conductive path is connected to devices according to embodiments of the present application.

A shield conductive path W in this example is configured such that a plurality of (three, in this example) electrical wires 20 are shielded by being surrounded by a tubular shield portion 10. As shown in FIG. 1, the shield conductive path W is arranged under a floor of a vehicle body B so as to respectively connect devices M1 and M3 mounted in the rear portion of the vehicle body B and devices M2 and M4 mounted in the front portion of the vehicle body B in a vehicle such as a hybrid automobile. In this example, as shown in FIG. 2, two of the three electrical wires 20 are electrical wires (hereinafter, referred to as first electrical wires 20F) connecting the device M1 such as a high-voltage battery mounted in the vehicle rear portion and the device M2 such as an inverter mounted in the vehicle front portion, and the other one electrical wire 20 is an electrical wire (hereinafter, referred to as a second electrical wire 20S) connecting the device M3 such as a low-voltage battery mounted in the vehicle rear portion and the device M4 such as a fuse box mounted in the vehicle front portion. The devices M1 and M2 are accommodated in conductive shield cases.

Note that the electrical wires are not necessarily connected to the devices shown in this example, and may be connected to various devices. For example, if a low-voltage battery is mounted in the vehicle front portion, the electrical wires may connect a DC/DC converter mounted in the vehicle rear portion and the low-voltage battery mounted in the vehicle front portion. Furthermore, the number of electrical wires is not limited to three, and the number may be any number that is suitable for the connection form.

Figure 4:
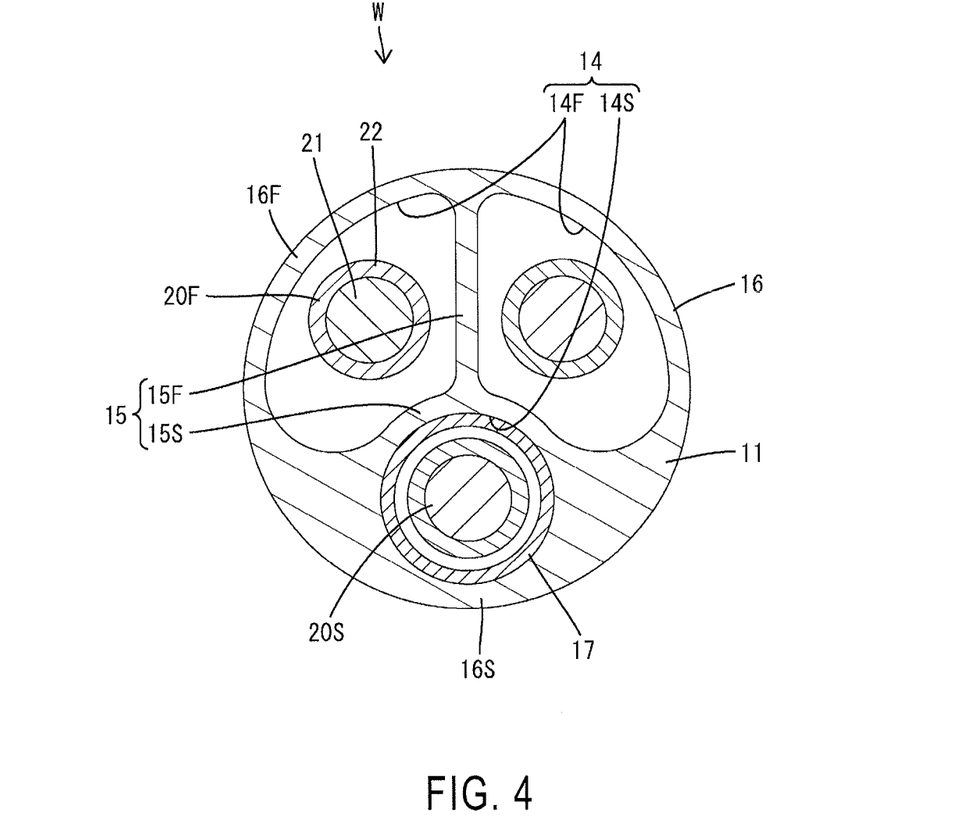
FIG. 4 is a cross-sectional view showing the configuration of the shield conductive path, according to embodiments of the present application, corresponding to a cross-section at the position A-A in FIG. 2.
Figure 5:
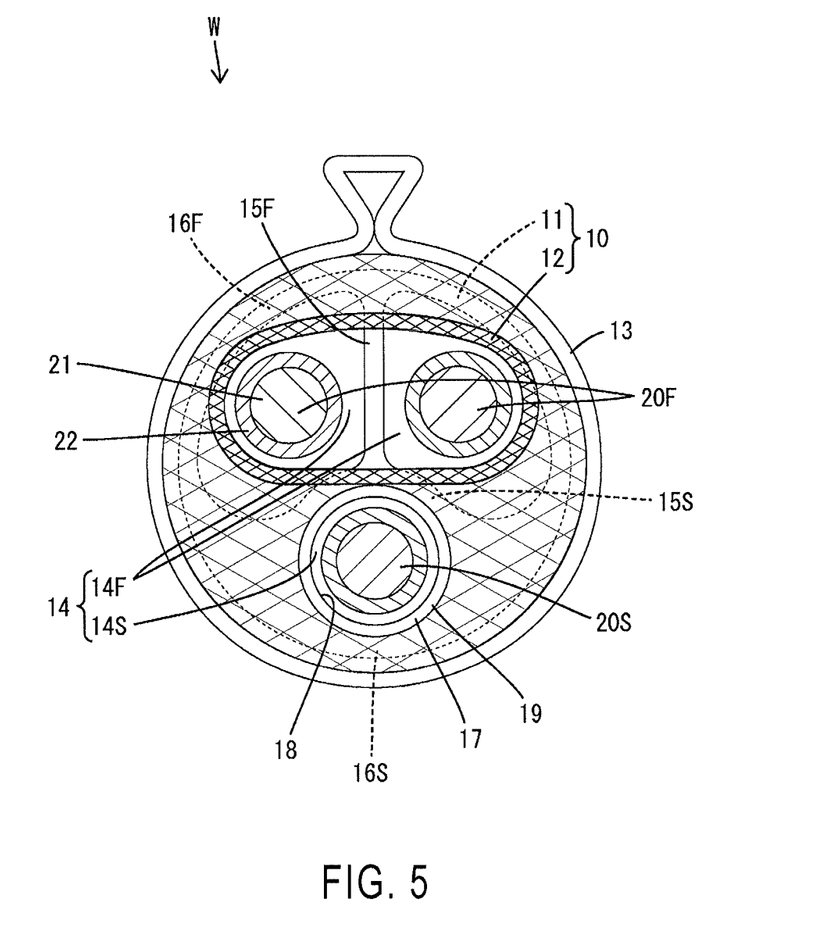
FIG. 5 is a cross-sectional view showing the configuration of the shield conductive path according to embodiments of the present application, corresponding to a cross-section at the position B-B in FIG. 2.

Each of the first electrical wires 20F and the second electrical wire 20S is a non-shield electrical wire 20 in which the outer circumference of a conductive material 21 is surrounded by an insulating coating 22 (see FIG. 4).

The first electrical wires 20F are high-voltage electrical wires forming high-voltage circuits, through which a high-voltage and large current can flow. Both end portions of the first electrical wires 20F are connected to unshown terminal fittings, and are electrically connected respectively to the devices M1 and M2.

The second electrical wire 20S is a low-voltage electrical wire forming a low-voltage circuit. Both end portions of the second electrical wire 20S are connected to terminal fittings 23 (FIG. 2 shows only one of the terminal fittings 23), and are electrically connected respectively to the devices M3 and M4. Note that there is no need for countermeasures to noise from the second electrical wire 20S, which is a low-voltage electrical wire.

The shield portion 10 has a shield pipe 11 through which all of the three electrical wires 20 are inserted, and flexible shield members 12 that are connected to both end portions of the shield pipe 11, and that can surround all of the three electrical wires 20, at portions thereof guided out from the shield pipe 11.

The shield pipe 11 is made of metal (iron, aluminum, copper, stainless steel, etc.), and has a cross-section whose outer shape is substantially in the shape of a perfect circle (see FIG. 4). As shown in FIG. 1, the shield pipe 11 is bent in three-dimensional directions along the arrangement route of the electrical wires 20. In this example, as shown in FIG. 1, the shield pipe 11 is arranged under a floor of the vehicle substantially in the vehicle front-rear direction, and both of the front and rear end portions are bent upward and introduced into the vehicle. The shield pipe 11 is fixed to the vehicle body side by a plurality of unshown fixing members made of resin.

Each of the flexible shield members 12 is a braided member obtained by knitting conductive thin wires made of metal (e.g., copper) into a mesh structure having a tubular shape. As shown in FIG. 2, one end of the flexible shield member 12 is crimped by a metal band 13 to the outer circumferential face of the shield pipe 11 and is secured thereto so that electrical conduction can be established, and the other end is secured by a metal band or the like to a connector connected to the devices M1 and M2 so that electrical conduction can be established. The flexible shield member 12 is not limited to the braided member, and it may be formed by winding metal foil or the like.

As shown in FIG. 4, the interior of the shield pipe 11 is provided with partition walls (partition portions) 15 that partition the interior space into a plurality of (three, in this example) electrical wire insertion paths 14. Two of the three electrical wire insertion paths 14 are electrical wire insertion paths (hereinafter, referred to as first insertion paths 14F)

through which the first electrical wires 20F are inserted, and the other one electrical wire insertion path is an electrical wire insertion path (hereinafter, referred to as a second insertion path 14S) through which the second electrical wire 20S is inserted.

The two first insertion paths 14F are formed on one side of, and in an area that is slightly larger than substantially half of, the shield pipe 11. Each of the first insertion paths 14F has an insertion space that is slightly larger than the second insertion path 14S. A wall face forming the first insertion paths 14F, at portions thereof linking the partition walls 15 and a circumferential wall 16 of the shield pipe 11, are formed as gently curved faces.

Of the partition walls 15, a partition wall (hereinafter, referred to as a first partition wall 15F) that partitions the two first insertion paths 14F from each other is formed as a support wall that supports the shield pipe 11 so as to prevent the shield pipe 11 from being deformed when the shield pipe 11 is bent.

The two first insertion paths 14F are symmetric with respect to the first partition wall 15F interposed therebetween. The first partition wall 15F has a thickness similar to that of the circumferential wall 16 of the shield pipe 11, at a portion thereof forming the first insertion paths 14F (hereinafter, referred to as a first circumferential wall portion 16F).

The second insertion path 14S has, along the entire length thereof, a cross-section that is substantially in the shape of a perfect circle. The second insertion path 14S is positioned substantially at the center in the arrangement direction of the two first insertion paths 14F.

Of the partition walls 15, a partition wall 15 (hereinafter, referred to as a second partition wall 15S) that partitions the first insertion paths 14F and the second insertion path 14S from each other is in the shape of an arc that is along the shape of the second insertion path 14S. Furthermore, the second partition wall 15S, at portions thereof linked to the circumferential wall 16 of the shield pipe 11, is thicker than the other portions. The first partition wall 15F is linked to the center of the second partition wall 15S.

The circumferential wall 16 of the shield pipe 11, at a portion thereof forming the second insertion path 14S (hereinafter, referred to as a second circumferential wall portion 16S) has a thickness similar to that of the first circumferential wall portion 16F.

Partition tube portions (partition portions) 17 are attached in one piece to both end portions of the shield pipe 11. The partition tube portions 17 are made of metal (iron, aluminum, copper, stainless steel, etc.), and have the shield function. The partition tube portions 17 are press-fitted to the end portions of the second insertion path (specific electrical wire insertion path) 14S. Each of the partition tube portions 17 is in the shape of a cylinder that surrounds the second electrical wire 20S, at each portion thereof guided out from the shield pipe 11. The partition tube portion 17 has an outer shape that is in the shape of a perfect circle matching the shape of the end portion of the second insertion path 14S. The partition tube portion 17 has a straight axis.

Figure 3:
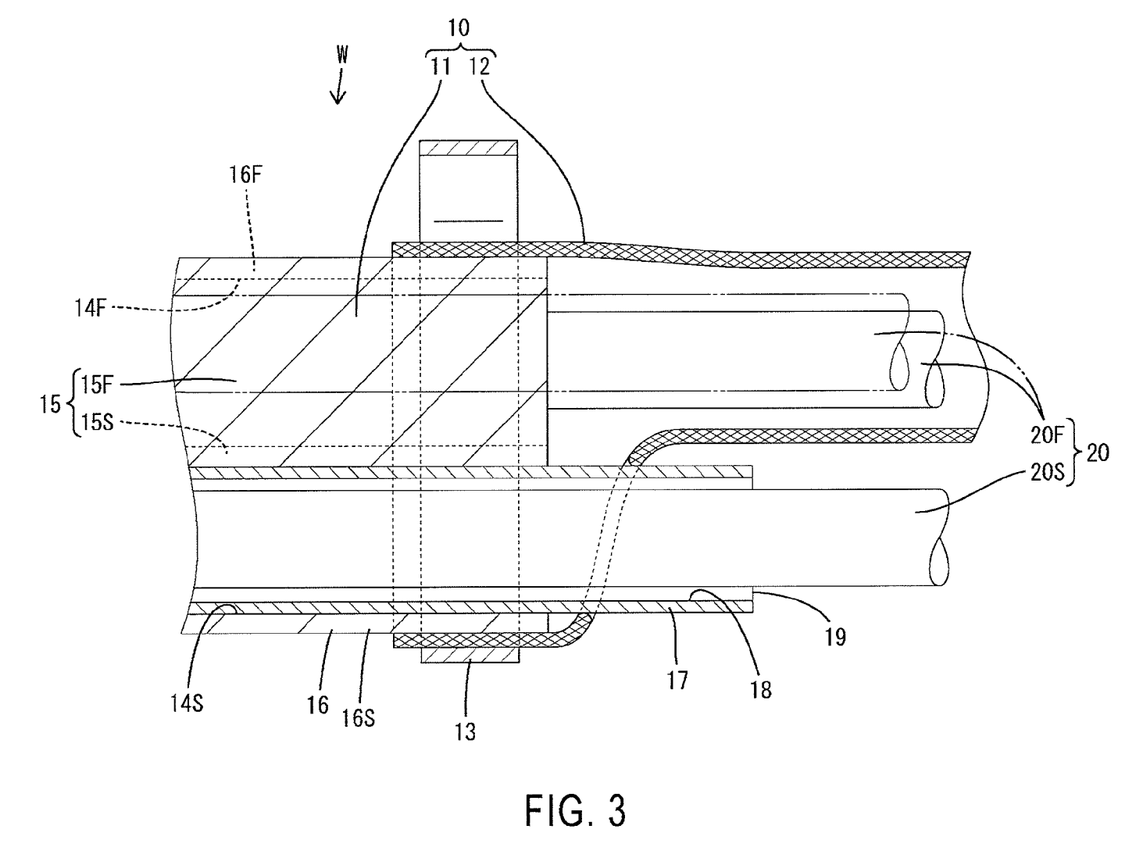
FIG. 3 is a partially enlarged cross-sectional view showing an electrical wire branch portion according to embodiments of the present application.

As shown in FIG. 3, one end of the partition tube portion 17 is press-fitted to the end portion of the second insertion path 14S, and the other end is projected from the end face of the shield pipe 11, and is further projected from the flexible shield member 12 to the outside. Note that the partition tube portion 17 is projected to the outside through a forcibly widened knitting stitch of the flexible shield member 12.

Inside the partition tube portion 17, an extension insertion path 18 is formed that is linked to the second insertion path 14S formed inside the shield pipe 11, and that extends the area in which the second electrical wire 20S is separated from the first electrical wires 20F, to the outside of the flexible shield member 12. If the partition tube portion 17 is press-fitted to the second insertion path 14S, the second insertion path 14S and the extension insertion path 18 are in communication with each other in the axial direction. The second electrical wire 20S inserted through the second insertion path 14S of the shield pipe 11 and the extension insertion path 18 of the partition tube portion 17 is guided out via an opening (hereinafter, referred to as a guiding-out opening 19) at the end portion of the partition tube portion 17.

According to the shield conductive path W of this example, a large portion of the first electrical wires 20F is inserted through the first insertion paths 14F of the shield pipe 11, and both end portions thereof arranged outside the end faces of the shield pipe 11 are each surrounded by the flexible shield member 12. Furthermore, a large portion of the second electrical wire 20S is inserted through the second insertion path 14S of the shield pipe 11, and both end portions thereof arranged outside the end faces of the shield pipe 11 are each inserted through the extension insertion path 18 of the partition tube portion 17 and guided out from the end face of the partition tube portion 17. That is to say, according to the shield conductive path W of this example, the second electrical wire 20S is surrounded by the partition tube portion 17 inside the flexible shield member 12, thereby being prevented from being affected by noise from the first electrical wires 20F.

Next, the working effects of the thus configured example will be described.

According to the shield conductive path W of this example, the three electrical wires 20 are shielded by being surrounded by the shield portion 10 configured by the tubular shield pipe 11 and the flexible shield members 12. The shield pipe 11 is provided with the partition walls 15 that partition the interior of the shield pipe 11 into the first insertion paths 14F and the second insertion path 14S. The second electrical wire 20S, at each portion thereof guided out from the shield pipe 11, is surrounded by the partition tube portion 17 projecting from the end face of the shield pipe 11 to the outside of the flexible shield member 12, and is guided out from the guiding-out opening 19 at the end portion of the partition tube portion 17 arranged outside the flexible shield member 12.

With this configuration, the second electrical wire 20S is guided out via the partition tube portion 17 to the outside of the flexible shield member 12, and, thus, the electrical wire 20S can be prevented from being affected by electromagnetic noise at a branch portion between the electrical wires 20F and 20S.

Furthermore, the partition tube portion 17 and the end portion of the second insertion path 14S are in the shape of perfect circles, and the partition tube portion 17 is press-fitted to the end portion of the second insertion path 14S. With this configuration, the partition tube portion 17 can be press-fitted with no gap to the end portion of the second insertion path 14S, and, thus, noise can be reliably blocked.

EXAMPLE 2

Next, a shield conductive path 30 according to Example 2, which exemplifies a second embodiment of the present application, will be described in detail with reference to FIGS. 6 and 7.

The shield conductive path 30 of this example is different from that in Example 1, in that a guiding-out opening 31 of the second electrical wire 20S is formed at an intermediate position on the circumferential wall 16 of the shield pipe 11, at a portion thereof forming the second insertion path 14S. The constituent elements that are the same as those in Example 1 are denoted by the same reference numerals, and a description thereof will not be repeated.

As in Example 1, the shield conductive path 30 according to this example has the shield pipe 11 through which all of two first electrical wires 20F and one second electrical wire 20S are inserted, and the tubular flexible shield members 12 connected to the end portions of the shield pipe 11.

Figure 7:
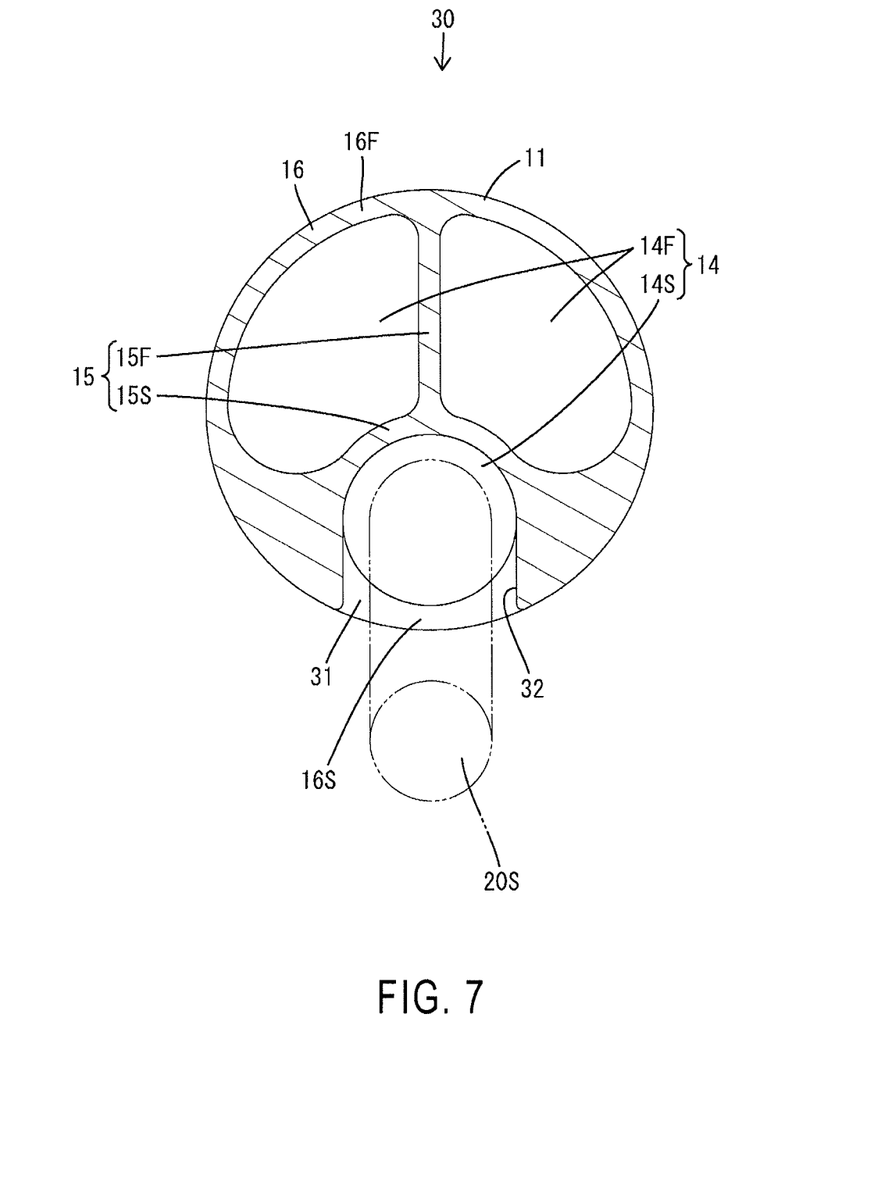
FIG. 7 is a cross-sectional view showing the configuration of the shield conductive path according to embodiments of the present application.

Furthermore, as in Example 1, the interior of the shield pipe 11 is provided with the partition walls 15 that partition the interior space into the three electrical wire insertion paths 14, two of the three electrical wire insertion paths 14 are the first insertion paths 14F through which the first electrical wires 20F are inserted, and the other one electrical wire insertion path is the second insertion path 14S through which the second electrical wire 20S is inserted (see FIG. 7).

Slit portions 32 that are cut out from the end faces toward the center of the shield pipe 11 are formed at both end portions of the shield pipe 11. Each of the slit portions 32 is formed in the second circumferential wall portion 16S forming the second insertion path 14S, of the circumferential wall 16 of the shield pipe 11. The slit portion 32 has a width that is larger than the width of the second electrical wire 20S, and that is, in this example, similar to the width of the second insertion path 14S. Accordingly, both end portions of the second insertion path 14S are exposed via the slit portions 32 to the outside along the entire width thereof (see FIG. 7).

Figure 6:
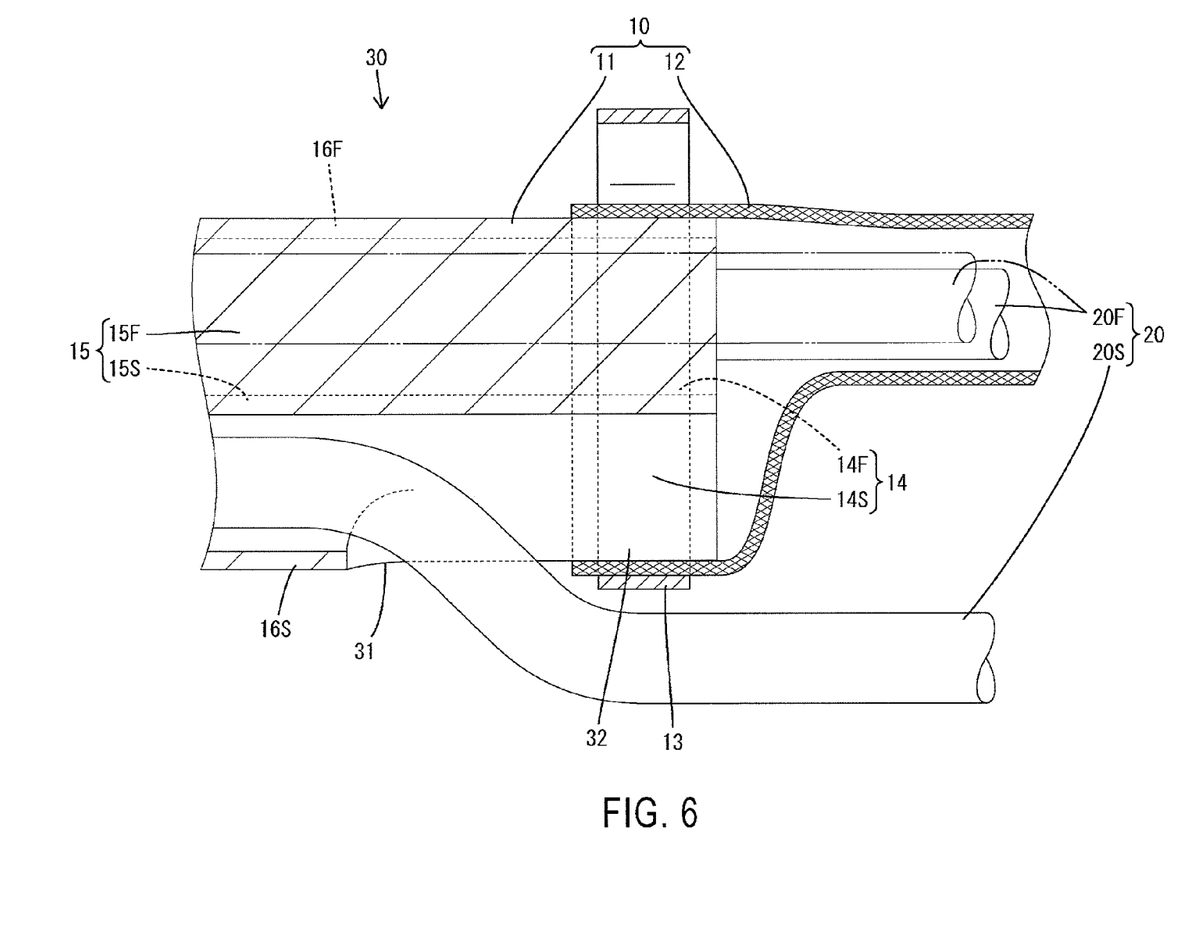
FIG. 6 is a partially enlarged cross-sectional view showing an electrical wire branch portion of the shield conductive path in Example 2.

As shown in FIG. 6, the second electrical wire 20S inserted through the second insertion path 14S is bent at the position of the slit portion 32 and is guided out from the end portion of the slit portion 32 to the outside of the shield pipe 11. That is to say, the end portion of the slit portion 32 functions as the guiding-out opening 31 via which the second electrical wire 20S is guided out. The edge portions (edge portions at the end opposite to the end face of the shield pipe 11) of the slit portion 32 forming the guiding-out opening 31 are formed in the shape of semicircles.

The flexible shield member 12 is connected to the end portion of the shield pipe 11, at a portion thereof closer to the end face of the shield pipe 11 than to the guiding-out opening 31, and the second electrical wire 20S is guided out from the shield pipe 11 via the guiding-out opening 31 positioned in the path before the flexible shield member 12, without extending via the internal portion of the flexible shield member 12.

As described above, in this example, the second electrical wire 20S is guided out from the shield pipe 11 within an area partitioned by the partition wall 15 from the first insertion paths 14F, and, thus, the electrical wire 20S can be prevented from being affected by electromagnetic noise at a branch portion between the electrical wires 20F and 20S.

OTHER EXAMPLES

The present application is not limited to the examples that have been described using the foregoing description and the drawings, and, for example, examples as described below are also embraced within the technical scope of the present application (1) In the examples above, embodiments of the present application were described with reference to a case in which the plurality of electrical wires 20 include high-voltage electrical wires and a low-voltage electrical wire. However, the present application can be applied to any case in which there is a risk of the influence of electromagnetic noise when a plurality of electrical wires are arranged close to each other. For example, the plurality of electrical wires may include a power wire and a signal wire.

(2) In the examples above, the shield pipe 11 is made of metal. However, there is no limitation to this, and the shield pipe may be made of any material as long as it has the shield function. For example, the shield pipe may be configured such that metal foil is coaxially embedded in a pipe made of resin.

(3) In the examples above, the flexible shield members 12 are braided members obtained by knitting conductive thin wires made of metal (e.g., copper) into a mesh structure having a tubular shape. However, there is no limitation to this, and, for example, the flexible shield member may be a corrugated tube through which metal foil is inserted around the entire circumference and along the entire length.

(4) In the examples above, the interior of the shield pipe 11 is partitioned into the three electrical wire insertion paths 14. However, there is no limitation to this, and the number of electrical wire insertion paths provided inside the shield pipe can be changed as appropriate according to the types of electrical wires that are desirably separately arranged.

(5) In the examples above, one type of electrical wire 20S of the two types of electrical wires 20F and 20S is guided out from the shield portion 10. However, there is no limitation to this, and, for example, a configuration is possible in which three or more types of electrical wires are surrounded by the shield portion and two or more types of electrical wires of the three types are drawn out from respectively corresponding guiding-out openings to the outside of the shield portion.

(6) In the examples above, the shield pipe has a cross-section whose outer shape is substantially in the shape of a perfect circle. However, there is no limitation to this, and, for example, the cross-section may be in the shape of an ellipse.

(7) In Example 1 above, the partition tube portions 17 are press-fitted to the end portions of the second insertion path 14S. However, there is no limitation to this, and, for example, the partition tube portions may be formed in one piece with the shield pipe by extrusion molding, or may be welded to the shield pipe.

(8) In Example 1 above, the partition tube portions 17 extend the second insertion path 14S. However, there is no limitation to this, and the partition tube portions may extend the first insertion paths, and the flexible shield members may be connected to the end portions of the partition tube portions.

(9) In Example 1 above, the partition tube portions 17 and the end portions of the second insertion path 14S are each in the shape of a perfect circle. However, there is no limitation to this, and they may be in any shape as long as the partition tube portions can be fixed to the end portions of the second insertion path.

(10) In Example 1 above, each of the partition tube portions 17 has a straight axis. However, there is no limitation to this, and the partition tube portions may be bent.

(11) In Example 1 above, the guiding-out openings 19 are formed as openings at the end faces of the partition tube portions 17. However, there is no limitation to this, and the guiding-out openings may be provided as openings on the circumferential walls of the partition tube portions, at portions thereof arranged outside the flexible shield members.

(12) In Example 2 above, the flexible shield members 12 are connected to the end portions of the shield pipe 11. However, there is no limitation to this, and, for example, the end portions of the shield pipe may be directly fixed to shield cases or the like of the devices.

(13) In Example 2 above, the guiding-out openings 31 are formed as the end portions of the slit portions 32 that are cut out at the end portions of the shield pipe 11. However, there is no limitation to this, and, for example, the guiding-out openings may be formed through the circumferential wall of the shield pipe as openings each having a closed circumference.

What is claimed is:

1. A shield conductive path comprising:
   a tubular shield portion surrounding a plurality of electric wires;
   a partition portion that partitions an interior space of the shield portion into a plurality of electrical wire insertion paths; and
   specific electrical wire inserted through a specific electrical wire insertion path of the plurality of electrical wire insertion paths that is guided out from a guiding-out opening formed in the shield portion, to the outside of the shield portion, wherein:
   the guiding-out opening is formed within an area, of the shield portion, provided with the partition portion, and
   the partition portion comprises:
      a partition wall that partitions an interior of the shield portion into the plurality of electrical wire insertion paths; and
      a partition tube portion that (i) is in the shape of a tube surrounding the specific electrical wire and (ii) projects from an end face of the shield portion, to the outside of the shield portion.

2. The shield conductive path according to claim 1, wherein the shield portion comprises:
   a shield pipe through which all of the plurality of electrical wires are inserted; and
   a tubular flexible shield member that (i) is connected to an end portion of the shield pipe and (ii) surrounds the electrical wires, at each portion thereof guided out from the shield pipe, and
   wherein the guiding-out opening is formed at an end portion of the partition tube portion arranged outside the flexible shield member.

3. The shield conductive path according to claim 2, wherein the partition tube portion and an end portion of the specific electrical wire insertion path are in the shape of perfect circles, and
   wherein the partition tube portion is press-fitted to the end portion of the specific electrical wire insertion path.

4. The shield conductive path according to claim 1, wherein the shield portion comprises a shield pipe through which all of the plurality of electrical wires are inserted, and
   wherein the guiding-out opening is formed at an intermediate position on a circumferential wall of the shield pipe, at a portion thereof forming the specific electrical wire insertion path.

5. The shield conductive path according to claim 4, wherein the intermediate position is immediately adjacent to a connection between the shield pipe and a flexible shield member on the circumferential wall of the shield pipe.

6. The shield conductive path according to claim 1, wherein the plurality of electrical wire insertion paths comprises:
   a first insertion path; and
   a second insertion path, the first insertion paths comprising an insertion space that is larger than an insertion space of the second insertion path.

7. The shield conductive path according to claim 6, wherein the plurality of electrical insertion paths comprise a third insertion path, wherein the third insertion path comprises an interior space that is larger than the interior space of the second insertion path.

8. Shield conductive path according to claim 7, wherein the third insertion path and the first insertion path are symmetrical with respect to a first partition wall interposed between the first insertion path and the third insertion path.

9. The shield conductive path according to claim 1,
   wherein the shield conductive path is disposed under a floor of a vehicle body, and
   wherein the shield conductive path connects a plurality of devices mounted to a rear portion of the vehicle body and a plurality of devices mounted in a front portion of the vehicle body.

10. A vehicle comprising:
    a power storage device mounted to a first portion of the vehicle; and
    an electrical device mounted to a second portion of the vehicle;
    wherein the shield conductive path according to claim 1 connects the power storage device and the electrical device.

11. A method path comprising:
    surrounding a plurality of electric wires with a shield portion;
    partitioning an interior space of the shield portion into a plurality of electrical wire insertion paths with partition portion;
    inserting a specific electrical wire through a specific electrical wire insertion path of the plurality of electrical wire insertion paths; and
    guiding the specific electrical wire out through a guiding-out opening formed in the shield portion to the outside of the shield portion, wherein:
    the guiding-out opening is formed within an area, of the shield portion, provided with the partition portion, and
    the partition portion comprises:
       a partition wall that partitions an interior of the shield portion into the plurality of electrical wire insertion paths; and
       a partition tube portion that (i) is in the shape of a tube surrounding the specific electrical wire and (ii) projects from an end face of the shield portion, to the outside of the shield portion.

* * * * *